United States Patent [19]

Katoh

[11] Patent Number: 4,853,253
[45] Date of Patent: Aug. 1, 1989

[54] METHOD OF ACTIVATING SURFACE OF SHAPED BODY FORMED OF SYNTHETIC ORGANIC POLYMER

[75] Inventor: Koichiroh Katoh, Abiko, Japan

[73] Assignee: Director General of Agency of Industrial Science and Technology, Japan

[21] Appl. No.: 163,894

[22] Filed: Mar. 4, 1988

[30] Foreign Application Priority Data

Mar. 30, 1987 [JP] Japan ................... 62-76764

[51] Int. Cl.$^4$ .......................... B05D 3/06; B05D 3/10
[52] U.S. Cl. .................... 427/54.1; 8/130.1; 427/160; 427/307; 427/316; 427/444
[58] Field of Search ............ 427/54.1, 316, 307, 427/160, 444; 8/130.1

[56] References Cited

U.S. PATENT DOCUMENTS 3,619,246  11/1971  Bragole .............................. 427/54.1

FOREIGN PATENT DOCUMENTS 3210593  3/1956  Japan .
58-4140  1/1983  Japan .
59-198716  9/1984  Japan .

OTHER PUBLICATIONS

Adhesion and Adhesives, 1971, vol. 15, p. 225.
Treatment for Improvement of Adhesive Property of Low Density Polyethylene, 11/83, Coating Technology, 1985, vol. 20, p. 94.
Treatment for Improvement of Adhesive Property of High–Density Polyethylene 11/85, Coating Technology, 1986, vol. 21, 312.
Treatment for Improvement of Adhesive Property of Low-Density Polyethylene 11/86, Coating Technology, 1987, vol. 22, p. 11.

Primary Examiner—Janyce Bell
Attorney, Agent, or Firm—Lorusso & Loud

[57] ABSTRACT

A shaped body formed of a synthetic organic polymer is surface-treated for increasing the surface energy by a method including the steps of contacting the surface with a UV ray-absorbing organic liquid at a temperature and for a period of time sufficient to swell the surface; and irradiating UV rays having wave lengths in the range of 1800–2100 Å on the swollen surface.

12 Claims, No Drawings

METHOD OF ACTIVATING SURFACE OF SHAPED BODY FORMED OF SYNTHETIC ORGANIC POLYMER

BACKGROUND OF THE INVENTION

This invention relates to a method for the treatment of a surface of a shaped body formed of a synthetic organic polymer for the activation of the surface.

Since synthetic organic polymers, such as polyolefins which consist only of saturated hydrocarbons and which are hydrophobic and highly crystalline in nature, generally has a low surface energy, the surfaces of shaped bodies such as sheets and fibers of such polymers are hard to be coated, printed, bonded or dyed. Therefore, it is necessary to pretreat such shaped bodies and to increase the surface energy thereof prior to coating, printing, bonding, dyeing or the like surface processing.

A variety of surface pretreating techniques have been hitherto proposed. For example, as pretreating methods for coating, printing and bonding, there are known a sand blast treatment, a treatment with solvent, a treatment with a chromic acid mixture, a flame treatment, a corona discharge treatment, a plasma treatment, a functional groups-introducing treatment and a photo-grafting treatment. These conventional methods, however, are not entirely satisfactory for the reasons as set forth below.

The sand blast treatment method is one in which granules of a grinding material are caused to impinge on a surface of a shaped body to be treated for roughing same. The granular grinding material causes fouling of the working environment and the product. The surface of the treated product is, therefore, required to be washed with water. Further, there are caused problems that the treatment makes the surface opaque and that the grinding material once cut into the surface cannot be removed.

The solvent treatment includes exposing, for a short period of time, a shaped body to vapors of a superheated, halogenated hydrocarbon so that an amorphous portion of the surface of the shaped body is etched by swelling. It is, however, necessary to provide over the treated surface a primer layer containing chlorinated propylene prior to coating. In addition, unless the primer coat is provided immediately after the treatment, the treatment soon becomes ineffective. The treatment sometimes causes distortion of the shaped body. The treated surface should be heated for the removal of the solvent remaining after the treatment. Additionally, this method is dangerous because of the necessity to handle vapors of a halogenated hydrocarbon which also tends to cause deterioration of the apparatus.

The treatment with chromic acid mixture includes heating the mixture (containing 75 parts of potassium bichromate, 120 parts of water and 1500 parts of concentrated sulfuric acid) to about 100° C., and immersing a shaped body to be treated in the heated mixture for about 5 min. This method incurs high costs for the treatment of the waste chromic acid mixture.

The flame treatment includes exposing the surface of a shaped body to be treated to an oxidizing flame (1000°–2500° C.) produced by the combustion of a gas containing excess air. The surface is liable to be distorted or melted by the heat.

The corona discharge treatment includes passing a film or film-like body to be treated through a space between an electrode and a metal roller while applying a high electric voltage therebetween. This method is not applicable to shaped bodies other than those of a film-like form.

The plasma treatment includes exposing the surface of a plastic body to a low temperature plasma so that the surface undergoes a chemical change by the action of dissociated oxygen and ultraviolet rays. Plasma of oxygen or air is used. This method is disadvantageous because of the necessity of an expensive apparatus.

The functional groups-introducing method includes irradiating UV rays on the surface of a shaped body in an atmosphere of chlorine, and then treating the irradiated surface with an alkali. This method poses a problem of handling very dangerous chlorine gas.

The photo-grafting method includes admixing benzophenone with polypropylene powder, forming the admixture into a film, and photo-treating the surface of the film in the presence of acrylamide in an oxygen-free atmosphere for photochemically graft-copolymerizing the acrylamide with the polypropylene. This method requires complicated steps and is economically disadvantageous.

As surface pretreatment methods for dyeing polypropylene fibers which are typical examples of fibers of an inactive polymeric material, there are proposed the following methods:

(1) a method in which the surface is oxidized with nitrogen dioxide;

(2) a method in which the surface is chlorinated and, if desired, then treated with an amine;

(3) a method in which the surface is sulfonated with fuming sulfuric acid and, if desired, then treated with an amine;

(4) a method in which the surface is chlorosulfonated by UV irradiation in an atmosphere of sulfur dioxide gas and chlorine gas and is then treated with an amine;

(5) a method in which the surface is heated after depositing thereon sulfolauric acid or sulfosalicylic acid and is then treated with an amine;

(6) a method in which the surface is treated with an alkylamine, pyrrole or naphthylamine;

(7) a method in which vinylpyridine or isopropenylpyridine is grafted on the surface;

(8) a method in which vinyl chloroacetate or vinyl sulfonate is grafted on the surface and thereafter the surface is treated with an amine;

(9) a method in which the surface is treated with an emulsion containing as a major component a chlorosulfonated polyolefin; and

(10) a method in which the surface is impregnated with tetrachlorosilicon.

These methods, however, are not industrially actually applied because they cannot be performed with safety, because the treated surface still cannot be sufficiently satisfactorily dyed and because they are not economically fully acceptable.

SUMMARY OF THE INVENTION

The present invention is aimed at the provision of a method of treating an inactive or inert surface of an organic polymeric shaped body which is devoid of the defects of the conventional methods. In accordance with the present invention, there is provided a method of treating a surface of a shaped body formed of a synthetic organic polymer, comprising the steps of:

contacting said surface with a UV ray-absorbing organic liquid at a temperature and for a period of time sufficient to swell said surface; and irradiating UV rays having wave lengths in the range of 1800–2100 Å on said swollen surface thereby increasing the surface energy of said surface of the shaped body.

The present invention will be described in detail below.

DESCRIPTION OF THE PREFERRED EMBODIMENTS

The term "synthetic organic polymer" used in the present specification is intended to refer to a synthetic resin having low surface energy. Examples of such synthetic resins include polyolefins, acetals and other synthetic organic polymers having an inactive surface which as such is difficult to bond, print, coat or dye. Illustrative of suitable synthetic organic polymers are as follows:

(1) Polypropylene;
(2) Copolymers of mixtures of two or more of polypropylene, polyethylene, ethylene-propylene rubber and the like polymer;
(3) Ethylene-propylene rubber;
(4) Copolymers or mixtures of ethylene-propylene rubber with another polymer or polymers;
(5) Polyethylene;
(6) Copolymers or mixtures of polyethylene with another polymer or polymers;
(7) Polymethylpentene;
(8) Polyacetal;
(9) Copolymers or mixtures of polyacetal with another polymer or polymers; and
(10) Blends of at least one of the above polymers (1)–(9) with a filler and/or an additive.

Any shaped body of the synthetic organic polymer may be used in the present invention. The shaped body may be, for example, a film, sheet, fiber, plate, rod, pipe or block.

A surface to be treated of the shaped body is first treated with a UV ray-absorbing organic liquid at a temperature and for a period of time sufficient to swell the surface with the organic liquid. The UV ray-absorbing organic liquid may be an organic solvent capable of absorbing a UV ray with a wave length in the range of 1800–2100 Å. Examples of such organic solvents include aromatic hydrocarbons such as benzene, xylene and toluene, chlorinated aliphatic hydrocarbons such as carbon tetrachloride, tetrachloroethylene and trichloroethylene, acrylic esters such as methyl acrylate, and acrylic amides such as acrylamide. Solutions of photosensitizers in the above organic solvents may also be used as the UV ray-absorbing liquid. Examples of the photosensitizers include acetophenone or its derivatives such as benzyldimethylketal, benzophenone or its derivatives such as michler's ketone, benzoin or its derivatives such as benzoin ethylether, sulfides such as dibenzylsulfide, and onium salts such as diphenyliodonium salt.

Above all, the use of a chlorinated hydrocarbon, especially tetrachloroethylene is preferred not only because of its high swelling properties but also because of its capability to provide chlorine radical upon being irradiated with a UV ray as described hereinafter.

The contact of the surface of the shaped body to be treated with the UV ray-absorbing liquid may be effected by immersion or any suitable coating method such as spray coating. The contact is performed at a temperature and for a period of time sufficient to swell the surface of the shaped body. More particularly, the contact is carried out preferably at a temperature in the range from 30° C. up to the boiling point of the UV absorbing liquid for a period of time for 1 second to 20 minutes, more preferably at a temperature in the range from 50 0° C. to a temperature lower by 5° C. than the boiling point for a period of time from 5 seconds to 5 minutes. By the contact at an elevated temperature, the organic liquid penetrates into amorphous portions constituting part of the surface of the shaped body, thereby to swell the surface. If desired, the contact may be carried out while applying an ultrasonic wave to the surface of the shaped body to improve swellability of the surface.

The swelling may be effected by contacting the surface of the shaped body to be treated with the UV ray-absorbing organic liquid heated to a suitable temperature preferably 50° C. or more. However, it is preferred that the swelling step be conducted by first heating the surface of the shaped body to be treated to a temperature of 30° C. or more and then contacting the heated surface with the UV ray-absorbing organic liquid maintained at a temperature lower by 10°–80° C. than that of the heated surface by any suitable cooling means. By this, vaporization of the organic liquid can be minimized without lowering the swelling efficiency.

That is, when the surface of the shaped body which has been heated to a high temperature, say over the boiling point of the UV ray-absorbing organic liquid, is contacted with the UV ray-absorbing organic liquid, the organic liquid in contact with the heated surface can be heated to a high temperature and can swell the surface with the simultaneous generation of vapors thereof. The vapors are, however, immediately condensed upon contact with the organic liquid which is present abundantly and maintained well below the boiling point thereof.

The heating of the surface may be effected by any known means as an infrared lamp, an electric heater, a microwave generator, a high frequency generator or an oven.

The shaped body whose surface to be treated has been thus swollen by contact at an elevated temperature with the UV ray-absorbing organic liquid is then subjected to a UV irradiation treatment so that the surface of the shaped body is activated and is converted to a state suitable for dyeing, printing, coating, bonding or the like processing. Since the UV ray-absorbing organic liquid incorporated into the swollen surface of the shaped body decreases in amount with time by evaporation, the UV irradiation is desired to be performed before lapse of a long period of time, preferably within 1 minute after the completion of the swelling treatment.

As a source of the UV rays, there may be used a low pressure or a high pressure mercury lamp having an envelope made of a synthetic quartz glass and capable of emitting a UV ray with a wave length of 1800–2100 Å. It is preferred that the wave length of the UV ray to be irradiated on the swollen surface be concentrated to 1849 Å. It is also preferable to use a UV source generating UV rays with a high intensity. The UV irradiation may be performed at a temperature of 30°–60° C. The atmosphere in which the irradiation is carried out is not specifically limited.

As described previously, a chlorinated hydrocarbon, especially tetrachloroethylene is preferably used as the UV ray-absorbing organic liquid because of its excellent surface activating properties. Such surface activation is considered to be attained according to the following mechanism. When a shaped body formed of a polyolefin and having a surface swollen with tetrachloroethylene is subjected to UV irradiation in an oxygen-containing atmosphere, the tetrachloroethylene can generate chlorine radicals which abstract the hydrogen atoms from the polyolefin to leave radicals on the polyolefin. Oxygen is then reacted with the radicals on the polyolefin to form oxygen-containing groups which are responsible for the increased surface energy of the resulting polyolefin shaped body.

The shaped body which has undergone the foregoing UV treatment is subjected, as such or after the removal of static electricity, to a printing, coating, bonding or any other desired treatment.

The method for the treatment of a surface of a shaped body according to the present invention provides the following advantages:

(1) The treated surface gives a smooth, beautiful and strong coated, printed or dyed layer;
(2) The method does not require priming:
(3) The method is simple, economical and does not require a long treatment time and, therefore, it is suited for industrial applications;
(4) The method may be carried out by the use of simple and inexpensive apparatus;
(5) No dangerous gases such as chlorine gas are used;
(6) The method does not cause deformation or melting of the surface to be treated;
(7) The method is applicable to any shaped bodies such as films, fibers, rods, plates, etc; and
(8) The method may be performed without generation of vapors of UV ray-absorbing organic liquid.

The following examples will further illustrate the present invention.

EXAMPLE 1

A polypropylene plate was immersed for 5 minutes in benzene maintained at 30° C. After being allowed to stand in the air for 5 minutes, the plate was subjected to UV irradiation using a low pressure mercury lamp having a synthetic quartz glass envelope. The irradiation was carried out in the air for 5 minutes with a distance between the lamp and the plate surface of 5 cm. An acrylic resin paint containing a polyacrylic ester as main ingredient dispersed in a ketone-base solvent was sprayed over the thus treated surface of about 30 min. after the completion of the UV irradiation to give a uniform beautiful coat. The coat was dried in the air at room temperature for about 24 hours and tested for its adhesive strength. The test was carried out by cutting the coated layer on the polypropylene plate into small squares each having a 2 mm side, then pressingly applying an adhesive tape (Trademark: MITSUBISHI UNI-CELLOPHANE TAPE 18), and peeling off the tape. The number of the cut squares remaining on the polypropylene plate was counted. The adhesive strength was calculated as a percentage of the number of the remaining squares on the basis of the original number of the squares before the stripping. The results are shown in Table 1.

The above procedure was repeated in the same manner as described except that the benzene was maintained at a temperature of 39° C. Similar procedures were repeated using a mercury lamp having a natural quartz envelope. The results are also summarized in Table 1.

TABLE 1

| Temperature of Benzene (°C.) | Adhesive Strength (%) | |
|---|---|---|
| | Natural Quartz | Synthetic Quartz |
| 30 | 5 | 42 |
| 39 | 42 | 53 |

The UV lamp having a synthetic quartz glass tube gives UV ray with a stronger intensity in wave length of 1849 Å than the natural quartz glass UV lamp does. This accounts for the higher surface energy increasing properties of the former lamp.

EXAMPLE 2

A plate formed of a polypropylene was immersed for a period of time as shown in Table 2 in benzene maintained at a temperature as shown in Table 2. After being allowed to stand in the air for a period of time as shown in Table 2, the plate was subjected to UV irradiation using a low pressure mercury lamp (200 W) having a synthetic quartz glass envelope. The irradiation was carried out in the air for a period of time as shown in Table 2 with a distance between the lamp and the plate surface as shown in Table 2. An acrylic resin paint containing a polyacrylic ester as a main ingredient dispersed in a ketone-base solvent was sprayed over the thus treated surface about 30 min. after the completion of the UV irradiation. The resultant coating was dried in the air at room temperature for about 24 hours and tested for its adhesive strength in the same manner as that in Example 1. The results are summarized in Table 2.

For the purpose of comparison, the above procedure was repeated in the same manner as described except that the solvent pretreatment was omitted. The results are also summarized in Table 2.

TABLE 2

| Swelling Treatment | | Standing | UV Irradiation | | Adhesive |
|---|---|---|---|---|---|
| Temperature (°C.) | Time (min) | Time (min) | Time (min) | Distance (cm) | Strength (%) |
| 27 | 0.5 | 5 | 5 | 5 | 2 |
| 27 | 1 | 5 | 5 | 5 | 20 |
| 27 | 2 | 5 | 5 | 5 | 37 |
| 27 | 5 | 5 | 5 | 5 | 65 |
| 27 | 10 | 5 | 5 | 5 | 93 |
| 40 | 1/6 | 5 | 5 | 5 | 10 |
| 40 | 1 | 5 | 5 | 5 | 64 |
| 40 | 2 | 5 | 5 | 5 | 88 |
| 40 | 5 | 5 | 5 | 5 | 90 |
| 40 | 10 | 5 | 5 | 5 | 93 |
| 60 | 1/6 | 5 | 5 | 5 | 15 |
| 60 | 0.5 | 5 | 5 | 5 | 36 |
| 60 | 1 | 5 | 5 | 5 | 92 |
| 60 | 2 | 5 | 5 | 5 | 92 |
| 60 | 5 | 5 | 5 | 5 | 98 |
| 60 | 10 | 5 | 5 | 5 | 98 |
| 60 | 5 | 5 | 0.5 | 5 | 84 |
| 60 | 5 | 5 | 1 | 5 | 99 |
| 60 | 5 | 5 | 2 | 5 | 100 |
| 60 | 5 | 5 | 5 | 5 | 98 |
| 60 | 5 | 5 | 10 | 5 | 90 |
| — | — | — | 5 | 5 | 0 |
| — | — | — | 10 | 5 | 3 |

EXAMPLE 3

A plate formed of a resin as shown in Table 3 was immersed for a period of time as shown in Table 3 in an organic solvent as shown in Table 3 maintained at a temperature as shown in Table 3. After being allowed to stand in the air for a period of time as shown in Table 3, the plate was subjected to UV irradiation using a low pressure memory lamp (200 W) having a synthetic quartz glass envelope. The irradiation was carried out in the air for a period of time as shown in Table 3 with a distance between the lamp and the plate surface as shown in Table 3. An acrylic resin paint containing a polyacrylic ester as main ingredient dispersed in a ketone-base solvent was sprayed over the thus treated surface about 30 min after the completion of the UV irradiation. The coating was dried in the air at room temperature for about 24 hours and tested for its adhesive strength in the same manner as that in Example 1. The results are summarized in Table 3.

TABLE 3

| Plate | Solvent | Swelling Treatment Temperature (°C.) | Swelling Treatment Time (min) | Standing Time (min) | UV Irradiation Time (min) | UV Irradiation Distance (cm) | Adhesive Strength (%) |
|---|---|---|---|---|---|---|---|
| PP*[1] | Benzene | 58 | 1 | 1 | 1 | 15 | 0 |
| PP | CCl4 | 58 | 1 | 1 | 1 | 15 | 0 |
| PP | CCl4/TCE*[2](1:1) | 58 | 1 | 1 | 1 | 15 | 15 |
| PP | CCl4/TCE(1:19) | 60 | 1 | 1 | 1 | 15 | 40 |
| PP | Trichloroethylene | 60 | 1 | 1 | 1 | 15 | 83 |
| PP | TCE | 60 | 1 | 1 | 1 | 15 | 100 |
| PP | Benzene | 52 | 1 | 1 | 1 | 1.5 | 100 |
| PP | CCl4 | 52 | 0.5 | 0.5 | 0.5 | 1.5 | 98 |
| PP | TCE | 52 | 0.5 | 0.5 | 0.5 | 1.5 | 98 |
| P/E*[3] | CCl4/TCE(1:1) | 58 | 1/6 | 0.5 | 1 | 5 | 100 |
| P/R*[4] | CCl4/TCE(1:1) | 58 | 1/6 | 0.5 | 1 | 5 | 100 |

*[1]Polypropylene
*[2]Tetrachloroethylene
*[3]Polypropylene/ethylene block copolymer
*[4]Mixture of polypropylene, ethylene/propylene rubber and talc

EXAMPLE 4

A plate formed polypropylene was heated by means of an infrared lamp to 90° C. and maintained at that temperature for 30 seconds. Then the plate was immediately immersed in an organic solvent as shown in Table 4 for 30 seconds. The solvent was maintained at 22° C. After being allowed to stand at room temperature for 30 seconds, the plate was subjected to a UV irradiation treatment conducted by means of a low pressure mercury lamp (200 W) having a synthetic quartz glass envelope in the air for 1 minute with the lamp being maintained at a distance of 1.5 cm from the surface of the plate. An acrylic resin paint containing a polyacrylic ester as a main ingredient dispersed in a ketone-base solvent was sprayed over the thus treated surface about 30 min after the completion of the UV irradiation to give a uniform beautiful coat. The coat was dried in the air at room temperature for about 24 hours and tested for its adhesive strength in the same manner as that in Example 1. The results are summarized in Table 4.

TABLE 4

| Solvent | Adhesive strength (%) |
|---|---|
| Benzene | 0 |
| CCl4 | 42 |
| Tetrachloroethylene/CCl4 (1:1) | 73 |
| Tetrachloroethylene | 89 |

EXAMPLE 5

A woven polypropylene fabric was immersed for 1 minute in a 1:1 (vol/vol) carbon tetrachloride-tetrachloroethylene mixed solvent maintained at 52° C. After being allowed to stand at room temperature for 5 minutes in the air, the fabric was subjected to a UV irradiation treatment using a low pressure mercury lamp (110 W) having a synthetic quartz glass envelope. The irradiation was performed on both sides of the fabric each for 1 minute in the air with a distance between the lamp and the fabric of 1.5 cm. The treated fabric was then immersed for 1 hour in a Methylene Blue solution (obtained by dissolving Methylene Blue in an aqueous acetic acid solution (pH 3) to a concentration of about 2 % by weight) maintained at about 52° C. When the resulting blue fabric was washed 10 times with warm water (about 35° C.), the fabric still remained light blue.

EXAMPLE 6

A woven polypropylene fabric was immersed for 5 minutes in a 1:1 (vol/vol) carbon tetrachloridetetrachloroethylene mixed solvent maintained at 50° C. After being allowed to stand at room temperature for 3 minutes in the air, the fabric was subjected to a UV irradiation treatment using a low pressure mercury lamp (110 W) having a synthetic quartz glass envelope. The irradiation was performed on both sides of the fabric each for 5 minutes in the air with a distance between the lamp and the fabric of 1.5 cm. The treated fabric was then immersed for 1 hour in a Methylene Blue solution (obtained by dissolving Methylene Blue in a solution (pH 4) of acetic acid in 95 % ethanol to a concentration of about 2 % by weight) maintained at about 52° C., followed by drying in the air for 30 minutes. When the colored fabric was washed 10 times with warm water (about 35° C.), the fabric still remained blue.

EXAMPLE 7

A plate formed of an acetal resin was immersed for 5 minutes in benzene maintained at 60° C. After being allowed to stand in the air for 5 minutes, the plate was subjected to UV irradiation using a low pressure mercury lamp (110 W) having a synthetic quartz glass envelope. The irradiation was carried out in the air. An acrylic resin paint containing a polyacrylic ester as a main ingredient dispersed in a ketone- base solvent was sprayed over the thus treated surface about 30 min. after the completion of the UV irradiation. The resultant coating was dried in the air at room temperature for about 24 hours and tested for its adhesive strength in the same manner as that in Example 1 to reveal that the adhesive strength was satisfactory.

EXAMPLE 8

A plate formed of a polymethylpentene resin was treated and then spray coated in the same manner as that in Example 7. The coating of the resulting plate showed good adhesive strength.

I claim:

1. A method of treating a surface of a shaped body formed of a synthetic organic polymer comprising the steps of:
   heating the surface to a first temperature of 30° C. or more; and then
   contacting said surface with a UV ray-absorbing organic liquid at a second temperature and for a period of time sufficient to swell said surface, said second temperature being 10°-80° C. lower than said first temperature; and
   irradiating UV rays having wave lengths in the range of 1800-2100 Å on said swollen surface thereby increasing the surface energy of said surface of the shaped body.

2. A method as set forth in claim 1, wherein said organic polymer is a polyolefin resin or a polyacetal resin.

3. A method as set forth in claim 1, wherein said organic polymer is at least one member selected from the group consisting of (a) polypropylene; (b) copolymers or mixtures of two or more of polypropylene, polyethylene, and ethylene-propylene rubber; (c) ethylene-propylene rubber; (d) copolymers or mixtures of ethylene-propylene rubber with another polymer or polymers; (e) polyethylene; (f) copolymers or mixtures of polyethylene with another polymer or polymers; (g) polymethyl-pentene; (h) polyacetal; (i) copolymers or mixtures of polyacetal with another polymer or polymers; (j) blends of at least one of the above polymers (a)-(i) with a filler; and (k) blends of at least one of the above polymers (a)-(i) with an additive.

4. A method as set forth in claim 1, wherein said UV ray-absorbing organic liquid is an organic solvent selected from aromatic hydrocarbon solvents, halogenated aliphatic hydrocarbon solvents, acrylic ester solvents and acrylamide solvents.

5. A method as set forth in claim 4, wherein said UV ray-absorbing organic liquid is a solution in said organic solvent of a photosensitizer selected from acetophenone and its derivatives, benzophenone and its derivatives, benzoin and its derivatives, sulfides and onium compounds.

6. A method as set forth in claim 4, wherein said UV ray-absorbing organic liquid is a chlorinated aliphatic hydrocarbon.

7. A method as set forth in claim 6, wherein said chlorinated aliphatic hydrocarbon includes tetrachloroethylene.

8. A method as set forth in claim 1, wherein said irradiation is performed in an oxygen-containing atmosphere.

9. A method as set forth in claim 1, wherein a majority of said UV rays to be irradiated on the swollen surface has a wavelength of 1849 Å.

10. The method of claim 9 wherein said irradiation is with a synthetic quartz lamp.

11. A method as set forth in claim 1, wherein said contacting said heated surface with the UV ray-absorbing organic liquid is performed for a period of 1 second to 20 minutes.

12. A method as set forth in claim 11, wherein said surface is heated to 50° C. or more.

* * * * *